US010763213B2

(12) United States Patent
Delalleau et al.

(10) Patent No.: US 10,763,213 B2
(45) Date of Patent: Sep. 1, 2020

(54) INTEGRATED CIRCUIT HAVING A HIDDEN SHARED CONTACT

(71) Applicant: STMicroelectronics (Rousset) SAS, Rousset (FR)

(72) Inventors: Julien Delalleau, Marseilles (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 143 days.

(21) Appl. No.: 16/037,595

(22) Filed: Jul. 17, 2018

(65) Prior Publication Data

US 2019/0027439 A1 Jan. 24, 2019

(30) Foreign Application Priority Data

Jul. 21, 2017 (FR) ...................................... 17 56938

(51) Int. Cl.
*H01L 23/535* (2006.01)
*H01L 29/78* (2006.01)
(Continued)

(52) U.S. Cl.
CPC ...... *H01L 23/535* (2013.01); *H01L 21/28035* (2013.01); *H01L 21/76895* (2013.01);
(Continued)

(58) Field of Classification Search
CPC ............. H01L 23/535; H01L 29/41725; H01L 21/823475; H01L 23/485; H01L 23/528; H01L 21/28035; H01L 21/76895; H01L 29/78; H01L 29/4933; H01L 27/1104; H01L 29/42376; H01L 29/665

See application file for complete search history.

(56) References Cited

U.S. PATENT DOCUMENTS 9,564,372 B2 * 2/2017 Pranatharthiharan ........................ H01L 29/66628
10,049,929 B2 * 8/2018 Hung ...................... H01L 29/78
(Continued)

OTHER PUBLICATIONS

Yoshitaka Narita et al: "A New CMOS SRAM Cell With Fully Planarizing Technology", 1987, Digest of Technical Papers. Symposium ON, IEEE, Piscataway, NJ, USA, May 22, 1987 (May 22, 1987), pp. 103-104, XP031240056, * figures 1,4.
(Continued)

*Primary Examiner* — John P. Dulka
(74) *Attorney, Agent, or Firm* — Crowe & Dunlevy

(57) ABSTRACT

An integrated circuit includes a substrate and an interconnect. A substrate zone is delineated by an insulating zone. A polysilicon region extends on the insulating zone and includes a strip part. An isolating region is situated between the substrate and the interconnect and covers the substrate zone and the polysilicon region. A first electrically conductive pad passes through the isolating region and has a first end in electrical contact with both the strip part and the substrate zone. A second end of the electrically conductive pad is in electrical contact with the interconnect. A second electrically conductive pad also passes through the isolating region to make electrical contact with another region. The first and second electrically conductive pads have equal or substantially equal cross sectional sizes, within a tolerance.

27 Claims, 5 Drawing Sheets

(51) Int. Cl.
*H01L 21/768* (2006.01)
*H01L 21/28* (2006.01)
*H01L 23/528* (2006.01)
*H01L 23/485* (2006.01)
*H01L 21/8234* (2006.01)
*H01L 29/417* (2006.01)
*H01L 29/66* (2006.01)
*H01L 29/423* (2006.01)
*H01L 27/11* (2006.01)
*H01L 29/49* (2006.01)

(52) U.S. Cl.
CPC .... *H01L 21/823475* (2013.01); *H01L 23/485* (2013.01); *H01L 23/528* (2013.01); *H01L 29/41725* (2013.01); *H01L 29/78* (2013.01); *H01L 27/1104* (2013.01); *H01L 29/42376* (2013.01); *H01L 29/4933* (2013.01); *H01L 29/665* (2013.01)

(56) References Cited

U.S. PATENT DOCUMENTS

| | | |
|---|---|---|
| 2008/0029836 A1 | 2/2008 | Zhu |
| 2009/0166745 A1* | 7/2009 | Takeuchi .......... H01L 21/76895 257/368 |
| 2015/0028399 A1* | 1/2015 | Xiong ................. H01L 29/7848 257/288 |
| 2016/0372332 A1* | 12/2016 | Pranatharthiharan ........................ H01L 29/66628 |
| 2017/0213889 A1* | 7/2017 | Gluschenkov ........ H01L 29/665 |
| 2018/0151560 A1* | 5/2018 | Hsu ................... H01L 21/76802 |

OTHER PUBLICATIONS

INPI Search Report and Written Opinion for FR 1756938 dated May 3, 2018 (8 pages).

* cited by examiner

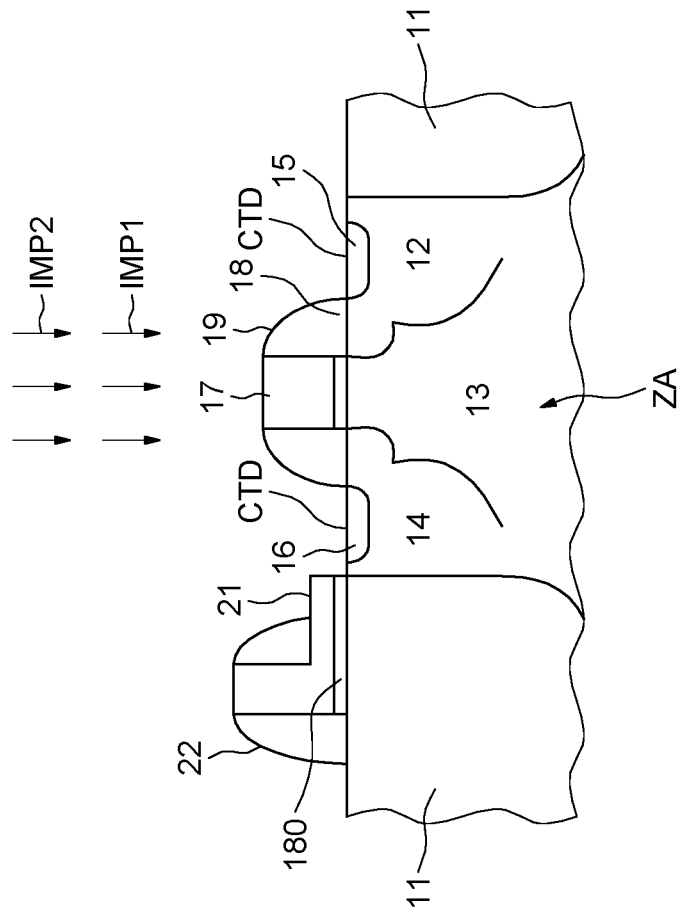
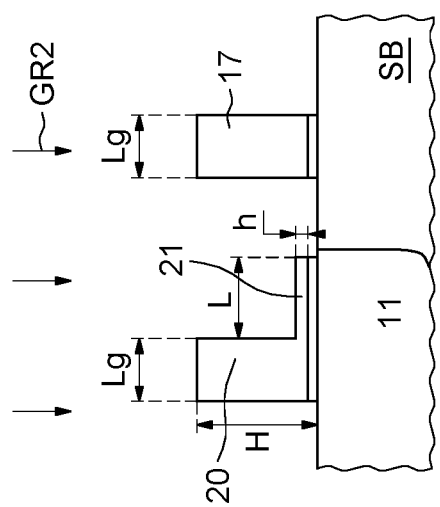

US 10,763,213 B2

INTEGRATED CIRCUIT HAVING A HIDDEN SHARED CONTACT

PRIORITY CLAIM

This application claims the priority benefit of French Application for Patent No. 1756938, filed on Jul. 21, 2017, the content of which is hereby incorporated by reference in its entirety to the maximum extent allowable by law.

TECHNICAL FIELD

Embodiments and modes of implementation of the invention relate to integrated circuits, in particular integrated circuits comprising MOS transistors, and in particular shared contacts between substrate zones, for example source or drain regions of MOS transistors and polysilicon regions that are situated on insulating zones, for example of shallow trench isolation (STI) type, and extending as far as another active zone.

BACKGROUND

One non-limiting application of such a configuration may be in SRAM memories.

SUMMARY

Reference is made to FIG. 1, which shows an integrated circuit CI comprising an MOS transistor T, a semiconductor substrate SB, an interconnection part 1 (known to those skilled in the art under the acronym 'BEOL': Back End Of Line), and a polysilicon region 2.

The MOS transistor T is produced on and in an active zone Z that is situated in the substrate SB and surrounded by an insulating zone 3, for example of shallow trench isolation (STI) type.

The active zone Z has a doped drain region D and a doped source region S that are separated by a channel region 4 and formed in the semiconductor substrate SB.

The drain and source regions have silicided parts CTS1, CTD1 in order to enable contact to be established.

The transistor T also has a gate region G that is isolated from the active zone Z by a gate oxide layer 5.

The gate region G is silicided and flanked by a lateral isolating region or spacer 6.

The polysilicon region 2 is situated on the insulating zone 3.

The polysilicon region 2 is partially flanked by a lateral isolating region or spacer 7.

This polysilicon region 2 extends, for example, as far as another active zone (not shown here) of the integrated circuit so as to form a gate region of another MOS transistor.

An isolating region I situated between the substrate SB and the interconnection zone 1 covers the transistor T and the polysilicon region 2. The isolating region I in particular has a dielectric layer that is known to those skilled in the art under the name pre-metal dielectric (PMD).

A pad E1 passes through the isolating region I and comprises a first end in electrical contact with the region 2 and with the silicided zone CTD1 of the transistor T, and a second end in electrical contact with a track of the first metallization level M1 of the interconnection part 1.

A pad E2 passes through the isolating region I and comprises a first end in electrical contact with the silicided zone CTS1 of the transistor T, and a second end in electrical contact with another track of the first metallization level M1 of the interconnection part 1.

These electrically conductive pads are known to those skilled in the art under the name 'contacts'.

The contact E1 has a cross section of dimension CD1, for example in a direction of the length of the transistor T, that is greater than the dimension CD2 of the cross section of the contact E2.

Said contact E1 is shared between the drain region D of the transistor T and the region 2 (in other words, the contact E1 makes physical and electrical contact with both region 2 and drain D).

This difference between the dimensions CD2 and CD1 has several drawbacks.

On the one hand, the shared contact E1 occupies a greater volume than that of the contact E2, and, on the other hand, the shared connections within the integrated circuit CI are easy to detect.

In reverse engineering, as it is known in the prior art, it is possible to locate the shared contact E1 given this difference in dimensions between the contact E1 and the contact E2.

There is thus a need to reduce the bulk occupied by a shared contact, while complicating reverse engineering of the integrated circuit.

According to embodiments and modes of implementation, it is advantageously proposed to incorporate a strip at the base of the polysilicon region, and thus hide the shared contact and reduce the volume thereof.

In an embodiment, an integrated circuit comprises: a semiconductor substrate and an interconnection part, at least one substrate zone situated in the substrate and delineated by an insulating zone, and a polysilicon region having at least one part situated on said insulating zone, said at least one part of the polysilicon region having, at the base thereof, a strip extending above the insulating zone in the direction of said at least one substrate zone, an isolating region situated between the substrate and said interconnection part and covering said at least one substrate zone and said polysilicon region, and an electrically conductive pad passing through said isolating region and having a first end in electrical contact with a portion of the strip and with a part of said at least one substrate zone and a second end in electrical contact with said interconnection part.

According to one embodiment, the first end of the electrically conductive pad has a first zone in contact with said strip portion, a second zone in contact with said substrate zone, and a protrusion between the first zone and the second zone.

In order to facilitate electrical conductivity, the portion of the strip has a metal silicide.

According to another embodiment, the integrated circuit has a plurality of additional contact pads passing through said isolating region and coming into contact with a plurality of substrate zones and/or component zones of the integrated circuit, the cross sections of these additional contact pads and the contact area of said contact pad between its first end and its second end having identical or substantially identical sizes, to within a tolerance.

The cross section of the shared contact is identical to that of another contact of the integrated circuit, in particular a contact of another electrode of a transistor, and as a result it is not possible to differentiate between such a shared contact and another type of contact (which is not shared), and the volume occupied by the shared contact is identical to that occupied by another type of contact.

The substrate zone on which the shared contact is electrically connected may be any substrate zone of an integrated circuit, for example a doped zone of a p-n junction.

That being said, it is particularly beneficial for this substrate zone to be a source or drain region of an MOS transistor.

In other words, according to one embodiment, the integrated circuit comprises at least one MOS transistor produced on and in an active zone situated in the substrate and delineated by said insulating zone, said active zone having a source region and a drain region, and said substrate zone is one of the source and drain regions.

According to another embodiment, the polysilicon region, situated on the insulating zone and provided with its strip, is a part of a gate region of another transistor. Particularly compact SRAM cells are thus advantageously produced, for example.

According to another aspect, what is proposed is a method for producing, within an integrated circuit, at least one shared electrically conductive contact pad between a substrate zone situated in a substrate of the integrated circuit and delineated by an insulating zone, and a polysilicon region having at least one part situated on said insulating zone. The method comprises: forming said polysilicon region, involving forming, at the base of said at least one part of the polysilicon region, a strip extending above the insulating zone in the direction of said at least one substrate zone, forming an isolating region situated above the substrate and covering said at least one substrate zone and said polysilicon region, forming said at least one electrically conductive pad passing through said isolating region and having a first end in electrical contact with a portion of the strip and with a part of said at least one substrate zone and a second end, and forming an interconnection region of the integrated circuit in electrical contact with said second end of said at least one electrically conductive contact pad.

In order to provide better electrical conductivity, the method further advantageously comprises a silicidation of said portion of the strip.

According to another mode of implementation, the method comprises simultaneously forming said at least one electrically conductive pad and a plurality of additional contact pads passing through said isolating region and coming into contact with a plurality of substrate zones and/or component zones of the integrated circuit, said simultaneous formation involving the use of a single contact mask having orifices of identical or substantially identical sizes, to within a tolerance.

The cross section of the shared contact is identical to that of an electrode of a transistor, and as a result it is not possible to differentiate between such a contact and another type of contact, and the volume and the area occupied by the contact of shared type are identical to those occupied by another type of contact. In addition, the contact mask is thus simplified.

According to one mode of implementation, the method further comprises, prior to the formation of said at least one electrically conductive pad, producing at least one MOS transistor on and in an active zone situated in the substrate and delineated by said insulating zone, said active zone having a source region and a drain region, and said substrate zone is one of the source and drain regions.

According to yet another mode of implementation, forming the polysilicon region and forming the gate region of the transistor comprises forming a layer of polysilicon above the substrate and the insulating zone, a first partial etching of the layer of polysilicon so as to obtain a first block and a second block that are separated by a residual layer of polysilicon, and a second etching of the structure obtained in the previous step so as to simultaneously form the polysilicon region equipped with its strip and the gate region of the transistor.

BRIEF DESCRIPTION OF THE DRAWINGS

Other advantages and features of the invention will become apparent upon examining the detailed description of completely non-limiting embodiments and the appended drawings, in which:

FIGS. 4 to 8 illustrate a method for manufacturing the shared electrically conductive contact pad.

DETAILED DESCRIPTION OF THE DRAWINGS

Figure 1:
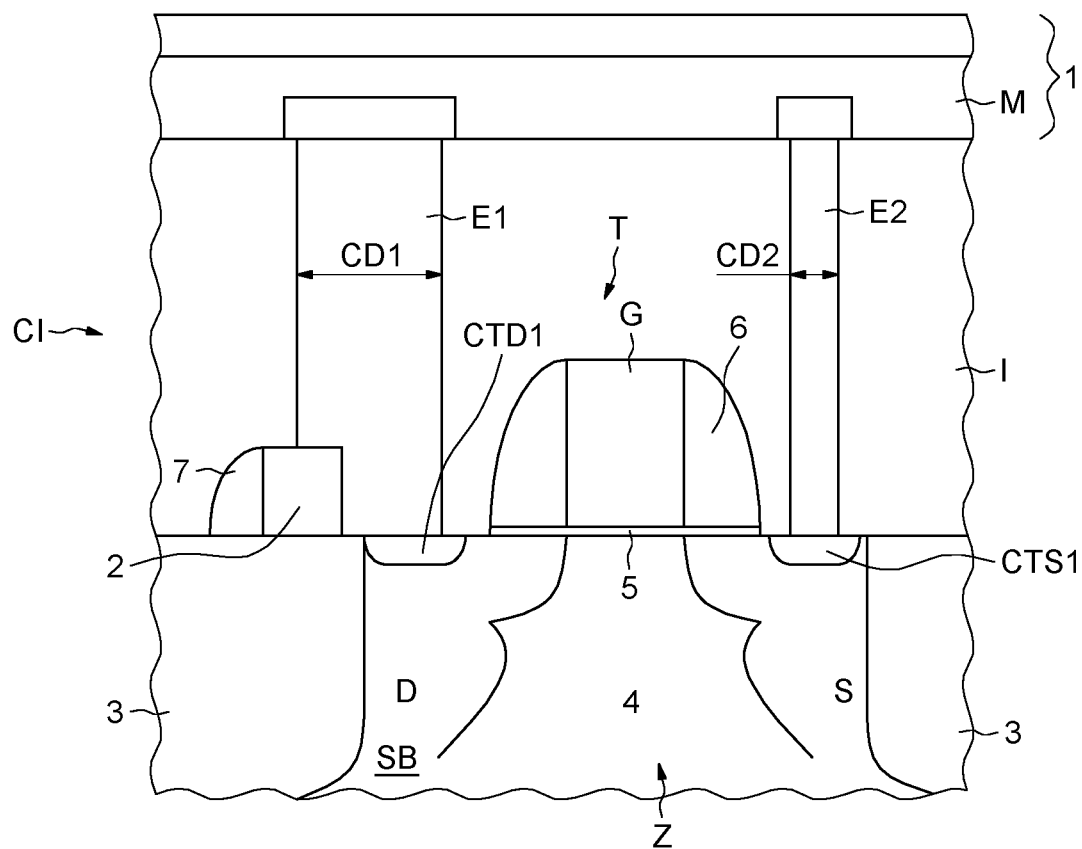
FIG. 1, described above, illustrates a shared contact according to the prior art.
Figure 2:
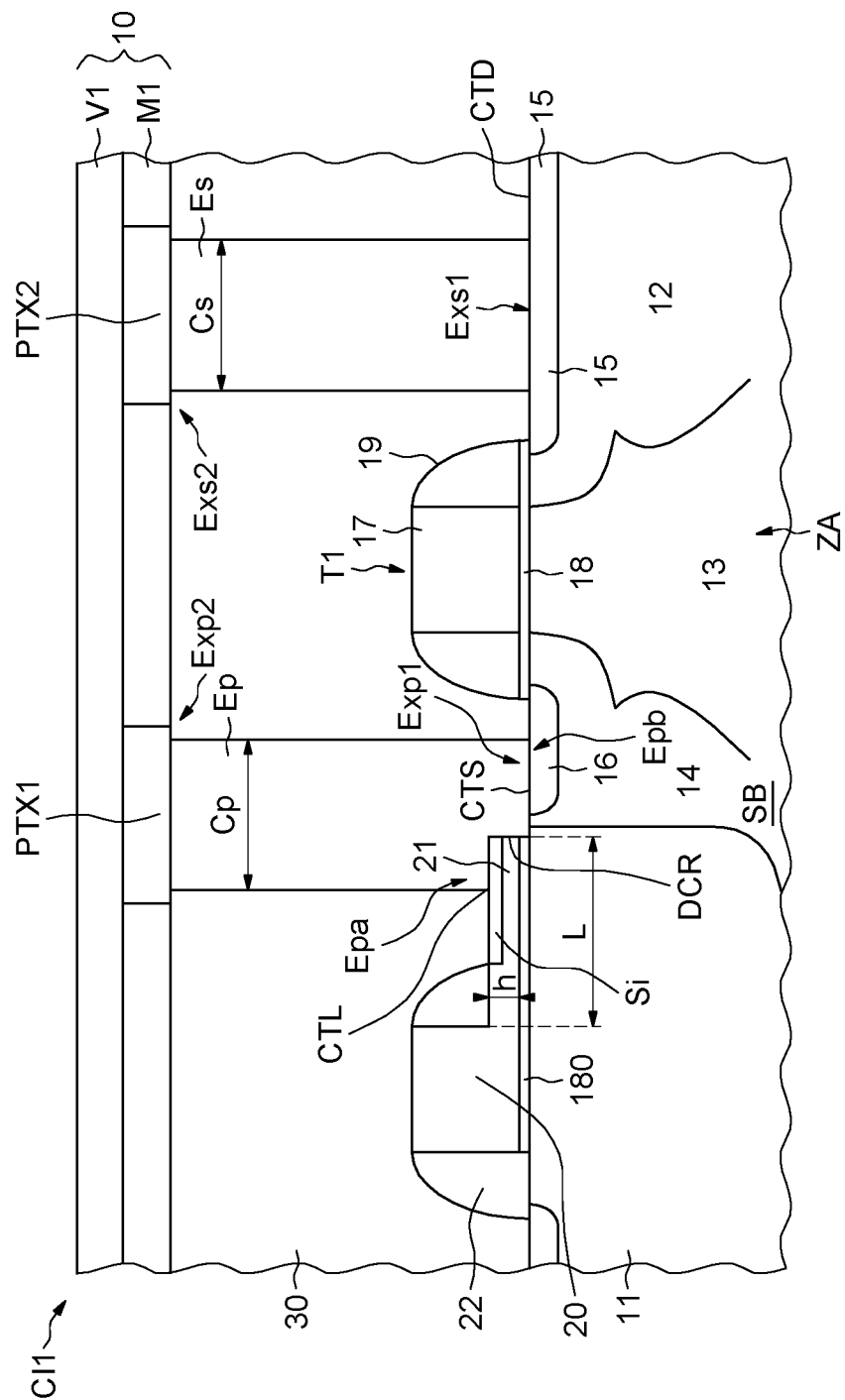
FIG. 2 depicts an exemplary embodiment of a shared contact between a polysilicon region and an MOS transistor.

Reference is made to FIG. 2, which depicts an exemplary embodiment of a shared contact Ep between a polysilicon region 20 and an MOS transistor T1.

FIG. 2 depicts an integrated circuit CD comprising an MOS transistor T1, a semiconductor substrate SB, an interconnection part 10 (Back End Of Line', BEOL), a polysilicon region 20, and an electrically conductive pad Ep with a cross section Cp, commonly referred to by those skilled in the art under the term 'contact'.

An isolating region 30 situated between the substrate SB and the interconnection zone 10 covers the transistor T1 and the polysilicon region 20. The isolating region 30 in particular contains a dielectric layer that is known to those skilled in the art under the name pre-metal dielectric (PMD).

The interconnection part 10 comprises a plurality of metallization and via levels, only a first metallization level M1 and a first via level V1 of which are depicted here.

The MOS transistor T1 is situated on and in an active zone ZA that is situated in the substrate SB and surrounded by an insulating zone 11, for example of shallow trench isolation (STI) type.

The active zone ZA has, for the transistor T1, a doped drain region 12 and a doped source region 14 that are separated by a channel region 13 and that are formed in the semiconductor substrate SB.

The substrate SB may be a bulk substrate or else a semiconductor well, or else a semiconductor film of a substrate of silicon on insulator (SOI) type.

In the case of an NMOS transistor, the drain and source regions are n-doped. They are p-doped for a PMOS transistor.

The drain and source regions conventionally have silicided zones 15 and 16 in order to enable contact to be established.

The transistor T1 also has a gate region 17 that is isolated from the active zone ZA by a gate oxide layer 18.

The gate region 17 is silicided in its upper part and flanked by lateral isolating regions or spacers 19.

Figure 3:
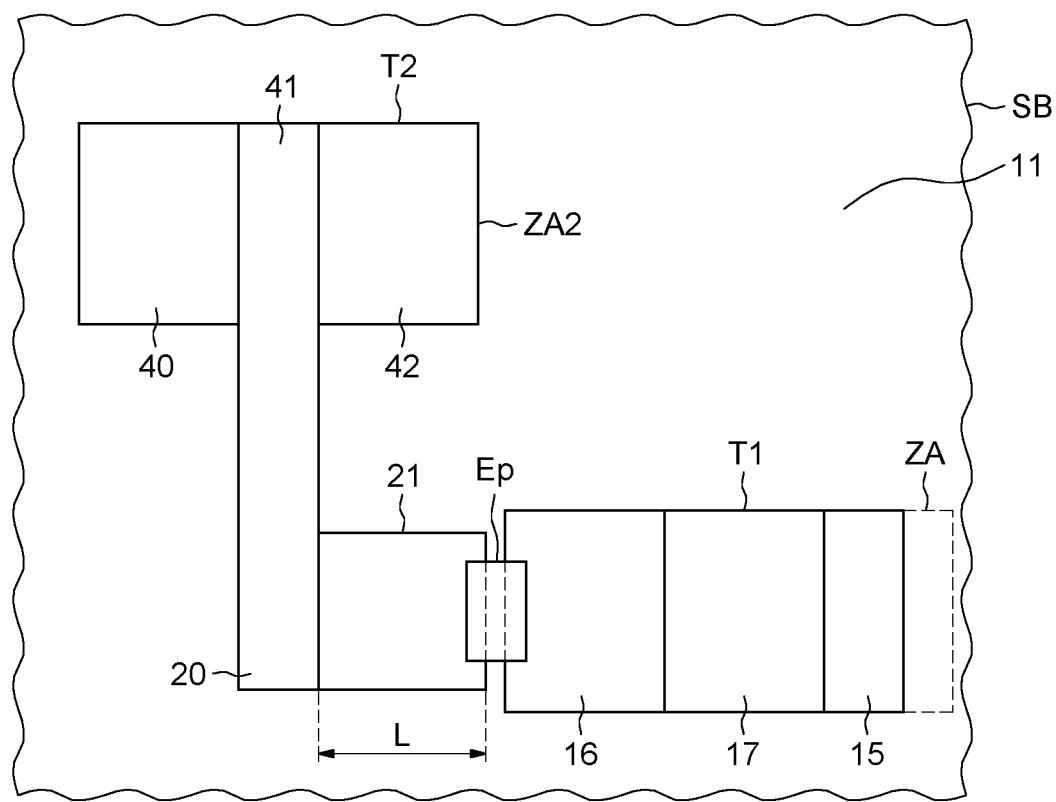
FIG. 3 is a partial plan view of the integrated circuit.

As also illustrated in FIG. 3, which is a partial plan view of the integrated circuit, the polysilicon region 20 does not extend laterally onto the active zone ZA. However, in this case it extends towards another active zone ZA2 of the integrated circuit so as to form a gate region 41 of another transistor T2 having a source region 40 and a drain region 42.

The polysilicon region 20 has, at the base thereof, a strip 21 of length L and of height h, situated above an insulating layer 180 resulting from the formation of the gate oxide layer 18. This insulating layer 180 is situated above the insulating zone 11.

The strip 21 extends in the direction of the silicided zone 16 of the source region 14 of the MOS transistor T1.

The length L of the strip 21 is chosen such that it does not extend beyond the insulating zone 11.

The strip 21 is at least partially silicided Si, so as to enable contact to be established via an electrically conductive pad or contact Ep.

The polysilicon region 20 is partially flanked by a lateral isolating region or spacer 22.

The entire part Si of the strip 21 not protected by the spacer 22 is silicided.

The pad Ep passes through the isolating region 30 and comprises a first end Expl comprising a first zone Epa in electrical contact with a first silicided contact zone CTL of the strip 21 and a second zone Epb in electrical contact with the silicided zone 16 of the source region 14 of the transistor T1, and a second end Exp2 in electrical contact with a track PTX1 of the first metallization level M1 of the interconnection part 10.

The first end Exp1 of the electrically conductive pad Ep has a protrusion DCR between the first contact zone Epa and the second contact zone Epb.

The pad Ep therefore forms a shared contact between the polysilicon region 20 and the source region 14 of the transistor T1.

The integrated circuit CI1 furthermore has another electrically conductive contact pad Es of cross section Cs passing through the isolating region 30 and comprising a first end Exs1 in electrical contact with the silicided zone 15 of the transistor T1 and has a second end Exs2 in contact with another track PTX2 of the first metallization level M1 of the interconnection part 10.

The cross section Cs of the contact pad Es and the cross section Cp of the contact pad Ep between its first end Exp1 and its second end Exp2 are of identical or substantially identical sizes, to within a tolerance (±1-3%, for example) associated with the manufacturing process used to make the integrated circuit.

The electrically conductive pads Ep and Es are conventionally made from tungsten, for example.

An example of a method for manufacturing the shared electrically conductive contact pad Ep is now described, with reference in particular to FIGS. 4 to 8.

It is assumed, for example, that the integrated circuit is produced using 40 nm technology. The critical dimensions CD of the gates (gate length) of the MOS transistors are equal to 40 nm in this case. The gates are in this case made of polysilicon.

It is also assumed that the strip has a length L of 60 nm and a height h of 10 nm.

The elements that are identical to those described above are denoted by the same numerical references.

Figure 4:
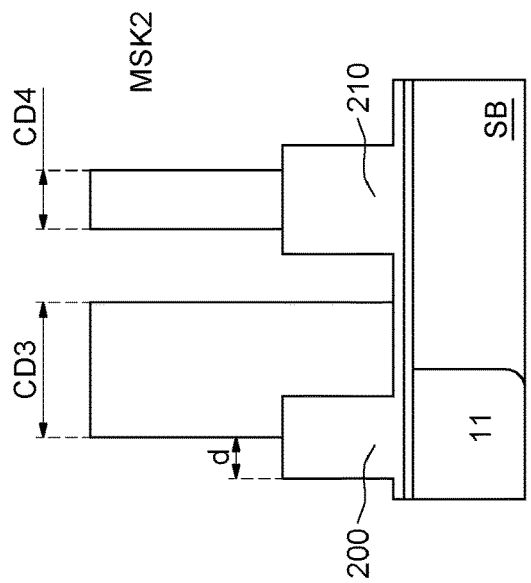

In FIG. 4, a layer of silicon dioxide 25 and then a layer of polysilicon 26 generally surmounted by a hardmask layer (not shown here for the sake of simplicity) are formed on the substrate SB in a conventional and known manner. The layer of polysilicon 26 has a height H of 80 nm in this case.

Above the layer 26 are formed two resin blocks 40 and 41 that are obtained in a conventional and known manner through photolithography, insolation and growth of a layer of resin. The resin block 40 has a dimension CD1 equal to 50 nm and the resin block 41 has a dimension CD2 of 60 nm.

Figure 5:
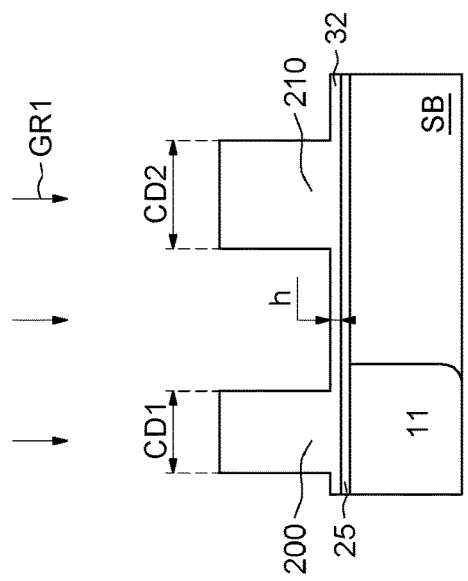

In another step illustrated in FIG. 5, a first partial conventional etching GR1 is performed using the resin blocks 40 and 41 and the hardmask layer as etching masks. A first polysilicon block 200 having a critical dimension equal to CD1 and a second polysilicon block 210 having a critical dimension equal to CD2 are obtained. The layer of polysilicon 26 is plasma-etched over a time period so as to leave intact, at the base of the two blocks 200 and 210, a layer 32 of polysilicon with a height h equal to 10 nm.

Figure 6:
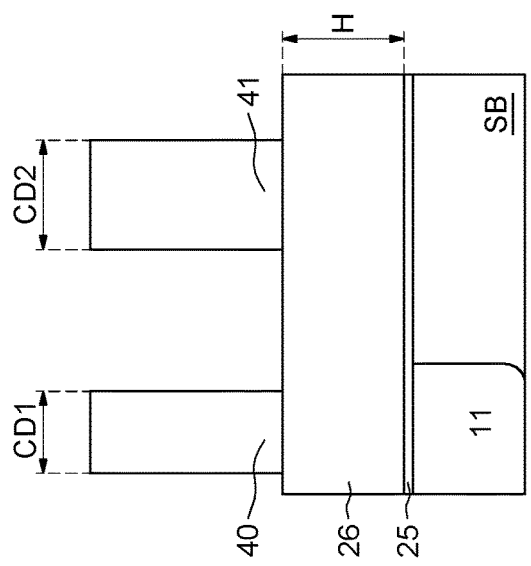

Next, as illustrated in FIG. 6, two other resin blocks having a length CD3 of 100 nm and a length CD4 of 40 nm are defined in a conventional manner. The resin block of length CD4 is centered on the block 210, and the resin block of length CD3 partially covers the block 200 so as to leave a free distance d of 10 nm (for example) at that end of the block 200 that is opposite the block 210.

As illustrated in FIG. 7, selective plasma etching GR2 is performed. The gate region 17 and the polysilicon region 20 of height H, comprising, at the base thereof, a strip 21 of length L and of height h extending above the substrate SB in the direction of the gate region 17, are obtained. The length Lg of the regions 17 and 20 is equal to 40 nm in this case.

Next, as illustrated in FIG. 8, a first implantation IMP1 of dopants is performed, and the spacers 19 and 22 are then produced in a conventional manner. The first implantation IMP1 is of the lightly doped drain (LDD) type, as it is known to those skilled in the art, and prevents the drain-channel junction from being excessively abrupt.

A second implantation IMP2 of dopants is performed so as to produce the source region 14 and the drain region 12.

Next, the silicided drain and source zones 15 and 16 and the silicided gate zone 17 are formed in a conventional manner so as to obtain the transistor T1 of FIG. 2. The entire part of the strip 21 not protected by the spacer 22 is silicided.

Next, in another step, the isolating region 30 situated above the substrate SB and covering the MOS transistor T1 and the polysilicon region 20 are formed in a conventional manner.

The electrically conductive pad Ep passing through the isolating region 30 and having a first end Exp1 in electrical contact with the silicided portion of the strip 21 and with the silicided zone 16 of the transistor T1 is formed in a conventional manner.

The electrically conductive pad Es passing through the isolating region 30, the first end Exs1 of which pad comes into contact with the contact zone CTD of the transistor T1, is formed at the same time. The simultaneous formation of the electrically conductive pads Ep and Es requires the use of a single contact mask having orifices of identical or substantially identical sizes, to within a tolerance.

The contacts are conventionally produced through etching of the isolating region 30 and then filling of the orifices obtained in particular with a metal, for example tungsten.

Next, the interconnection region 10 of the integrated circuit CI1 in electrical contact with the second ends Exp2 and Exs2 of the pads Ep and Es is formed in a conventional manner so as to obtain the integrated circuit CI1 of FIG. 2.

The invention is not limited to the modes of implementation and embodiments described above, but encompasses all variants thereof.

Although a shared contact Ep between a polysilicon region 20 and the source region 14 of a transistor T1 has been described, it would also be possible to produce a shared contact between a polysilicon region and any zone of the substrate, without this being a drain or source zone of a transistor, for example a n-doped or p-doped zone of a junction.

Advantageously, the volume occupied by the shared contact Ep is smaller than the volume occupied by a shared contact according to the prior art. Moreover, the dimension of the area of the shared contact is identical to that of the other contacts. As a result, the shared contact is difficult to detect using conventional investigation means.

The invention claimed is:

1. An integrated circuit, comprising:
a semiconductor substrate including at least one substrate zone delineated by an insulating zone;
a polysilicon region having at least one part situated on said insulating zone, said at least one part of the polysilicon region having a side edge and, at a base of the at least one part, a strip extending perpendicularly away from the side edge above the insulating zone in a direction of said at least one substrate zone;
an interconnection part;
an isolating region situated between the substrate and said interconnection part and covering said at least one substrate zone and said polysilicon region; and
an electrically conductive pad passing through said isolating region and having a first end in electrical contact with both a portion of the strip and a part of said at least one substrate zone and a second end in electrical contact with said interconnection part,
wherein said portion of the strip has a metal silicide.

2. The integrated circuit according to claim 1, wherein the first end of the electrically conductive pad has a first zone in contact with said portion of the strip, a second zone in contact with said substrate zone, and further including a protrusion extending between the first zone and the second zone.

3. The integrated circuit according to claim 1, further comprising a plurality of additional contact pads passing through said isolating region and coming into contact with a plurality of substrate zones and component zones of the integrated circuit, wherein cross sections of the plurality of additional contact pads and a cross section of said electrically conductive pad between the first end and the second end are identical or substantially identical, to within a tolerance.

4. An integrated circuit comprising:
a semiconductor substrate including at least one substrate zone delineated by an insulating zone;
a polysilicon region having at least one part situated on said insulating zone, said at least one part of the polysilicon region having a side edge and, at a base of the at least one part, a strip extending perpendicularly away from the side edge above the insulating zone in a direction of said at least one substrate zone;
an interconnection part;
an isolating region situated between the substrate and said interconnection part and covering said at least one substrate zone and said polysilicon region;
an electrically conductive pad passing through said isolating region and having a first end in electrical contact with both a portion of the strip and a part of said at least one substrate zone and a second end in electrical contact with said interconnection part; and
at least one MOS transistor produced on and in an active zone delineated by the insulating region, said active zone having a source region and a drain region, and said substrate zone being one of the source and drain regions.

5. The integrated circuit according to claim 4, wherein said at least one MOS transistor includes a further polysilicon region forming a first gate region, said polysilicon region forming part of a second gate region of another MOS transistor, wherein a combined width of the at least one part and said strip exceeds a width of the further polysilicon region.

6. The integrated circuit according to claim 4, wherein the first end of the electrically conductive pad has a first zone in contact with said portion of the strip, a second zone in contact with said substrate zone, and further including a protrusion extending between the first zone and the second zone.

7. The integrated circuit according to claim 4, further comprising a plurality of additional contact pads passing through said isolating region and coming into contact with a plurality of substrate zones and component zones of the integrated circuit, wherein cross sections of the plurality of additional contact pads and a cross section of said electrically conductive pad between the first end and the second end are identical or substantially identical, to within a tolerance.

8. An integrated circuit, comprising:
a semiconductor substrate including at least one substrate zone delineated by an insulating zone;
a polysilicon region having at least one part situated on said insulating zone, said at least one part of the polysilicon region having a side edge and, at a base of the at least one part, a strip extending perpendicularly away from the side edge above the insulating zone in a direction of said at least one substrate zone;
an interconnection part;
an isolating region situated between the substrate and said interconnection part and covering said at least one substrate zone and said polysilicon region; and
an electrically conductive pad passing through said isolating region and having a first end in electrical contact with both a portion of the strip and a part of said at least one substrate zone and a second end in electrical contact with said interconnection part;
wherein said polysilicon region is a part of a gate region of another transistor.

9. The integrated circuit according to claim 8, wherein an insulating gate sidewall spacer is provided on said edge of said at least one part of the polysilicon region, but no insulating gate sidewall spacer is provided on a side edge of the strip.

10. The integrated circuit according to claim 8, wherein the first end of the electrically conductive pad has a first zone in contact with said portion of the strip, a second zone in contact with said substrate zone, and further including a protrusion extending between the first zone and the second zone.

11. The integrated circuit according to claim 8, further comprising a plurality of additional contact pads passing through said isolating region and coming into contact with a plurality of substrate zones and component zones of the integrated circuit, wherein cross sections of the plurality of additional contact pads and a cross section of said electrically conductive pad between the first end and the second end are identical or substantially identical, to within a tolerance.

12. A method for producing, within an integrated circuit, at least one shared electrically conductive contact pad between a substrate zone situated in a semiconductor substrate of the integrated circuit and delineated by an insulating zone, and a polysilicon region having at least one part situated on said insulating zone, the method comprising:
forming said polysilicon region by forming, at a base of said at least one part of the polysilicon region, a strip extending perpendicularly away from a side edge of said at least one part and above the insulating zone in the direction of said substrate zone;
forming an isolating region situated above the semiconductor substrate and covering said substrate zone and said polysilicon region;
forming said at least one shared electrically conductive contact pad passing through said isolating region and having a first end in electrical contact with both a portion of the strip and a part of said at least one substrate zone and having a second end; and
forming an interconnection region of the integrated circuit in electrical contact with said second end of said at least one shared electrically conductive contact pad; and
siliciding said portion of the strip.

13. The method according to claim 12, comprising simultaneously forming said at least one shared electrically conductive contact pad and a plurality of additional contact pads passing through said isolating region and coming into contact with a plurality of substrate zones and component zones of the integrated circuit, wherein simultaneously forming comprises using a single contact mask having orifices of identical or substantially identical sizes, to within a tolerance.

14. A method for producing, within an integrated circuit, at least one shared electrically conductive contact pad between a substrate zone situated in a semiconductor substrate of the integrated circuit and delineated by an insulating zone, and a polysilicon region having at least one part situated on said insulating zone, the method comprising:
forming said polysilicon region by forming, at a base of said at least one part of the polysilicon region, a strip extending perpendicularly away from a side edge of said at least one part and above the insulating zone in the direction of said substrate zone;
forming an isolating region situated above the semiconductor substrate and covering said substrate zone and said polysilicon region;
forming said at least one shared electrically conductive contact pad passing through said isolating region and having a first end in electrical contact with both a portion of the strip and a part of said at least one substrate zone and having a second end; and
forming an interconnection region of the integrated circuit in electrical contact with said second end of said at least one shared electrically conductive contact pad; and
producing, prior to forming said at least shared one electrically conductive contact pad, at least one MOS transistor on and in an active zone situated in the semiconductor substrate and delineated by said insulating zone, said active zone having a source region and a drain region, and said substrate zone being one of the source and drain regions.

15. The method according to claim 14, wherein said at least one MOS transistor includes a gate region and wherein said polysilicon region is a further gate region of another MOS transistor, and wherein a combined width of the at least one part and said strip exceeds a width of the gate region of said at least one MOS transistor.

16. The method according to claim 14, wherein forming the polysilicon region and forming the gate region of the transistor comprises:
forming a layer of polysilicon above the substrate and the insulating zone,
first partially etching the layer of polysilicon so as to obtain a first block and a second block that are separated by a residual layer of polysilicon, and
second etching of the first and second blocks so as to simultaneously form the polysilicon region equipped with the strip and the gate region of the transistor.

17. The method according to claim 14, further comprising forming an insulating sidewall spacer on the side edge of said at least one part but not forming an insulating sidewall spacer on a side edge of the strip.

18. The method according to claim 14, comprising simultaneously forming said at least one shared electrically conductive contact pad and a plurality of additional contact pads passing through said isolating region and coming into contact with a plurality of substrate zones and component zones of the integrated circuit, wherein simultaneously forming comprises using a single contact mask having orifices of identical or substantially identical sizes, to within a tolerance.

19. An integrated circuit, comprising:
a semiconductor substrate including a first active region delimited by an insulating region;
a first doped region within the first active region;
a second doped region within the first active region;
a strip of polysilicon extending over said insulating region and including a first portion having a first thickness and a second portion having a second thickness that is less than the first thickness;
a pre-metal dielectric layer covering the semiconductor substrate and the strip of polysilicon;
a first contact extending through the pre-metal dielectric layer and having an end that makes contact with both the first doped region and the second portion of the strip of polysilicon; and
a second contact extending through the pre-metal dielectric layer and having an end that makes contact with the second doped region;
wherein a cross section of the first contact and a cross section of the second contact have identical or substantially identical sizes, to within a tolerance.

20. The integrated circuit of claim 19, wherein the first and second doped regions are source/drain regions of a transistor.

21. The integrated circuit of claim 19, wherein said strip of polysilicon extends beyond the insulating region over a second active region to form a gate electrode of a first transistor.

22. The integrated circuit of claim 21, wherein the first and second doped regions are source/drain regions of a second transistor.

23. The integrated circuit of claim 19, further comprising a first silicide region at a top surface of the first doped region and a second silicide region at a top surface of the second portion of the strip of polysilicon, wherein the first contact makes contact with both the first and second silicide regions.

24. The integrated circuit of claim 19, further comprising a third silicide region at a top surface of the second doped region, wherein the second contact makes contact with the third silicide region.

25. The integrated circuit of claim 19, further comprising an insulating sidewall spacer positioned on a top surface of the second portion of the strip of polysilicon and adjacent a sidewall of the first portion of the strip of polysilicon.

26. The integrated circuit of claim 25, wherein there is no insulating sidewall spacer on a side edge of the second portion of the strip of polysilicon.

27. The integrated circuit of claim 19, wherein the end of the first contact has a first zone in contact with second portion of the strip of polysilicon, a second zone in contact with the first doped region, and a protrusion between the first zone and the second zone.

* * * * *

UNITED STATES PATENT AND TRADEMARK OFFICE
CERTIFICATE OF CORRECTION

Page 1 of 1

PATENT NO. : 10,763,213 B2
APPLICATION NO. : 16/037595
DATED : September 1, 2020
INVENTOR(S) : Julien Delalleau et al.

It is certified that error appears in the above-identified patent and that said Letters Patent is hereby corrected as shown below:

In the Specification

At Column 4, Line 26, please replace the term [[ CD ]] with -- CI1 --.

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*